United States Patent [19]

Kimata et al.

[11] Patent Number: 4,778,331

[45] Date of Patent: Oct. 18, 1988

[54] CARRIER SYSTEM FOR SILICON WAFER

[75] Inventors: Kazuo Kimata, Bisai; Susumu Ishikawa, Aichi, both of Japan

[73] Assignee: MECS Corporation, Aichi, Japan

[21] Appl. No.: 63,956

[22] Filed: Jun. 19, 1987

[30] Foreign Application Priority Data

Oct. 11, 1986 [JP] Japan .................. 61-155963

[51] Int. Cl.4 ................................. B65G 1/06
[52] U.S. Cl. ................... 414/661; 198/346.2; 198/468.6; 414/225; 414/417; 414/590; 414/744 B; 414/752
[58] Field of Search ............... 414/331, 417, 661, 590, 414/751, 752, 280, 282, 283, 225, 226, 749, 744 B; 901/16; 198/346.2, 468.6

[56] References Cited

U.S. PATENT DOCUMENTS

| | | | |
|---|---|---|---|
| 3,750,804 | 8/1973 | Lemelson | 414/283 X |
| 3,825,245 | 7/1974 | Osburn et al. | 414/749 X |
| 3,854,605 | 12/1974 | Proper et al. | 414/283 X |
| 4,289,441 | 9/1981 | Inaba et al. | 414/751 X |
| 4,299,529 | 11/1981 | Inaba et al. | 414/590 |
| 4,366,423 | 12/1982 | Inaba et al. | 318/563 |
| 4,419,039 | 12/1983 | Bengtsson | 414/417 X |
| 4,507,044 | 3/1985 | Hutchins et al. | 414/744 R |
| 4,566,346 | 1/1986 | Petiteau | 901/16 X |
| 4,566,847 | 1/1986 | Maeda et al. | 414/590 X |
| 4,651,863 | 3/1987 | Reuter et al. | 414/331 X |
| 4,654,955 | 4/1987 | Mathie | 414/226 X |
| 4,682,930 | 7/1987 | Hachisa | 414/751 X |

Primary Examiner—Robert J. Spar
Assistant Examiner—David A. Bucci
Attorney, Agent, or Firm—Armstrong, Nikaido, Marmelstein & Kubovcik

[57] ABSTRACT

There is disclosed a carrier system for carrying a silicon wafer or a cassette accommodating the wafers to arbitrary positions by loading an arm with them. This carrier system is arranged such that: a screw shaft is perpendicularly provided in a rotationally drivable manner between an upper plate and a bottom plate which are vertically connected through a plurality of guide bars to each other; a movable plate is so disposed as to be vertically movable by the rotation of the screw shaft and is guided by the guide bars in a vertically slidable manner between the upper plate and the bottom plate; a cylindrical member is perpendicularly so provided on the movable plate as to be rotationally drivable and penetrate the upper plate and protrude upwards therefrom; a horizontal movement member is fixed to an upper end of the cylindrical member; a carriage provided with the rotary arm is disposed in a horizontally movable manner on the horizontal movement member; a driving wire spanned between pulleys axially supported within the horizontal movement member is secured to the carriage; and the rotary arm including a wafer arm and a cassette arm which are disposed in positions orthogonal to each other is pivotally so supported on the carriage as to vertically rotate through approximately 90°. In this constitution, the carrier system suffices for taking the silicon wafers in and out of the cassette and carrying the cassette itself.

3 Claims, 9 Drawing Sheets

CARRIER SYSTEM FOR SILICON WAFER

BACKGROUND OF THE INVENTION

1. Field of the Invention

The present invention is concerned with a carrier system for carrying silicon wafers accomodated in a cassette in or out of a processing device or a measuring device.

2. Prior Art

In the case of measuring effecting a variety of processings on the silicon wafers or measuring the performance thereof by means of a measuring device, the silicon wafers are carried within a clean room while being accomodated in a shelf type cassette. The silicon wafers together with the cassette are brought close to the processing device or the measuring device, in which place the silicon wafers are taken out of the cassette to be transferred onto a stage of the processing device or the like.

As a conventional carrier system for carrying both the cassette and the wafers within the clean room, a belt conveyor type device has already been put into practical use. However, since such a device is incapable of moving vertically or laterally, a cassette elevator for moving the cassette up and down is required. In addition, placement of the processing device is confined, and it is necessary to separately install the devices for carrying the cassette and the wafers. This induces to problems wherein the costs of equipments increase and a space formed within the clean room is narrowed.

SUMARY OF THE INVENTION

A carrier system according to the present invention which is designed for carrying the silicon wafer or a cassette accomodating the slicon wafers to arbitrary positions by loading an arm with them comprises: a screw shaft rotatably and perpendicularly provided between a bottom plate and an upper plate which are linked to each other with the aid of a plurality of guide bars; a movable plate disposed between the upper plate and the bottom plate so that the movable plate is guided by the guide bars in a vertically slidable manner and makes an up-and-down motion by dint of rotation of the screw shaft; a cylindrical member vertically and rotatably provided on the movable plate, this cylindrical member protruding upwards such as to penetrate the upper plate; a horizontal moving member fixed to an upper end of the cylindrical member; a carriage disposed on the horizontal moving member in a horizontally movable manner, this carriage being equipped with a rotary arm; and a driving wire spanned between pulleys which are axially supported within the horizontal moving member, this wire being secured to the carriage, wherein the rotary arm includes a wafer arm and a cassette arm which are disposed at a right angle to each other and is pivotally supported on the carriage so that the arm is vertically rotatable through an angle of approximately 90°.

It is a primary object of the present invention to provide the silicon wafer carrier system capable of freely and efficiently carrying the silicon wafers and the cassette accomodating the wafers to the arbitrary positions.

DESCRIPTION OF THE PREFERRED EMBODIMENTS

Figure 1:
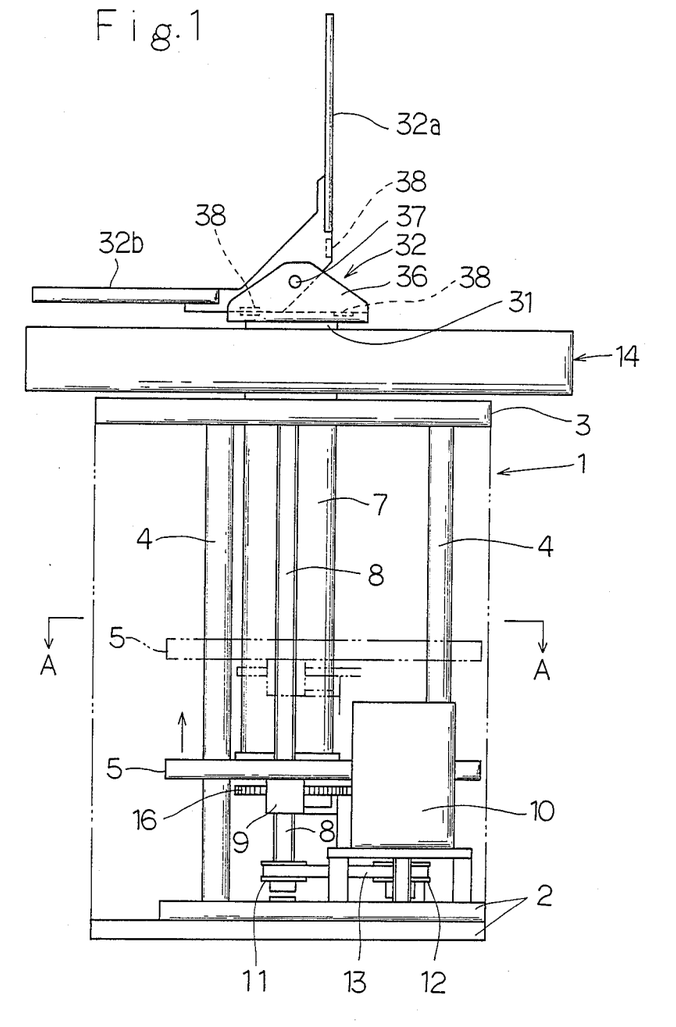
FIG. 1 is a front view of a carrier system whose outer cover is removed, showing one embodiment of the present invention.
Figure 2:
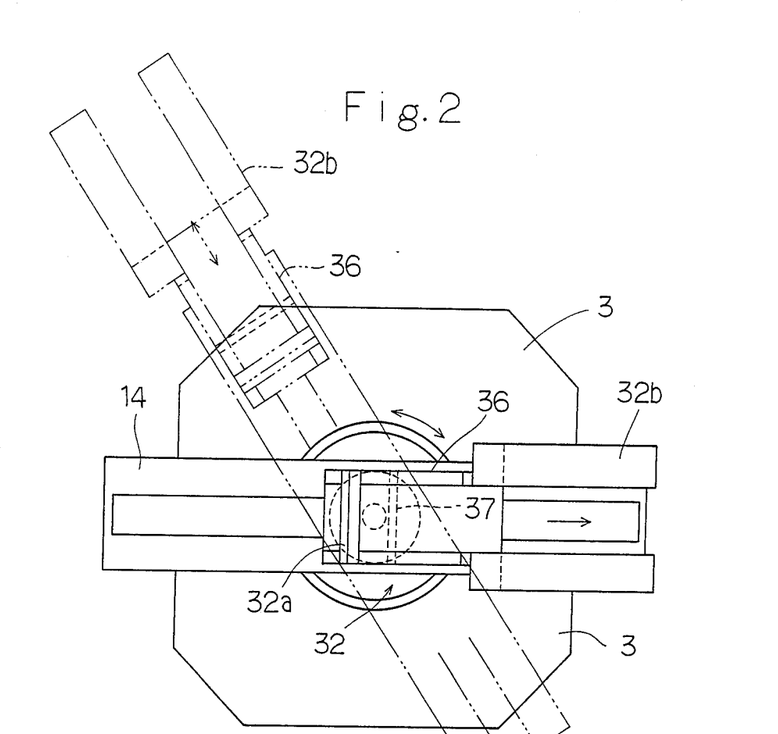
FIG. 2 is a plan view thereof.
Figure 3:
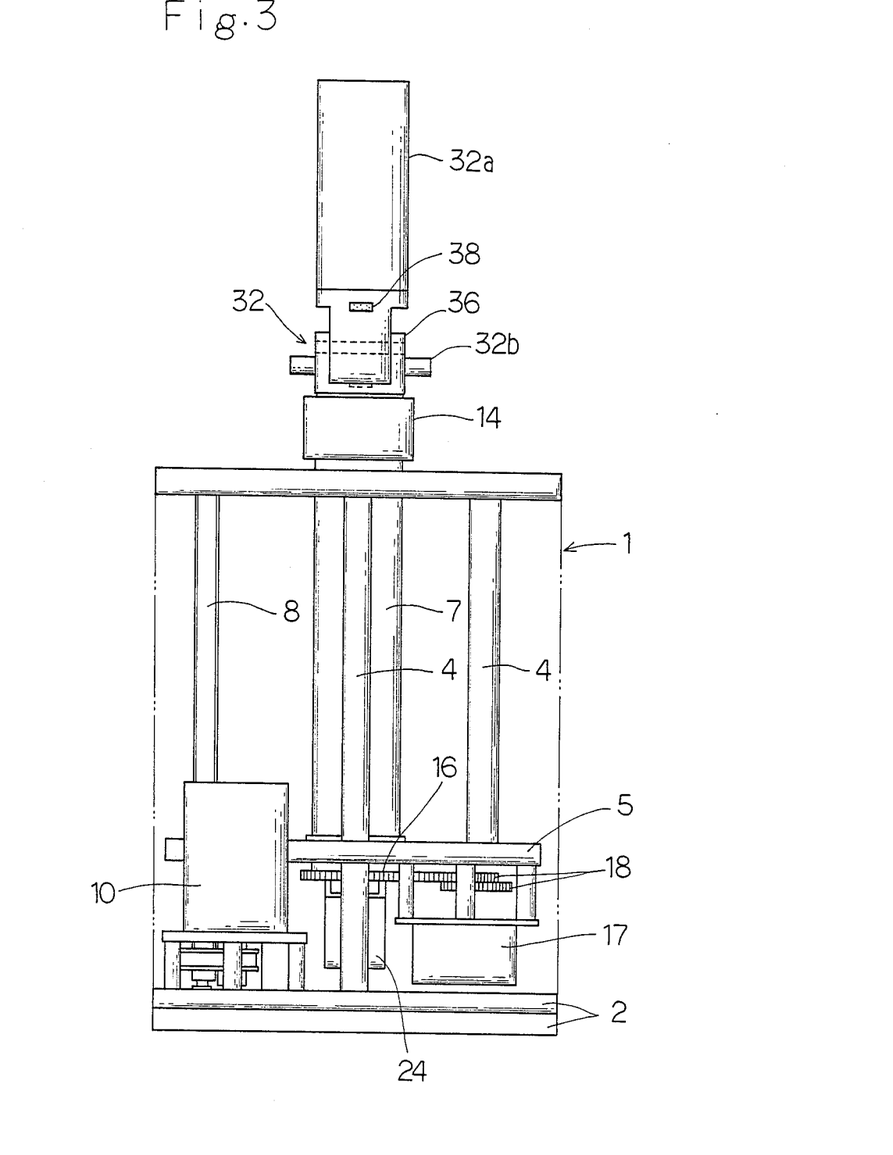
FIG. 3 is a right side view thereof.
Figure 4:
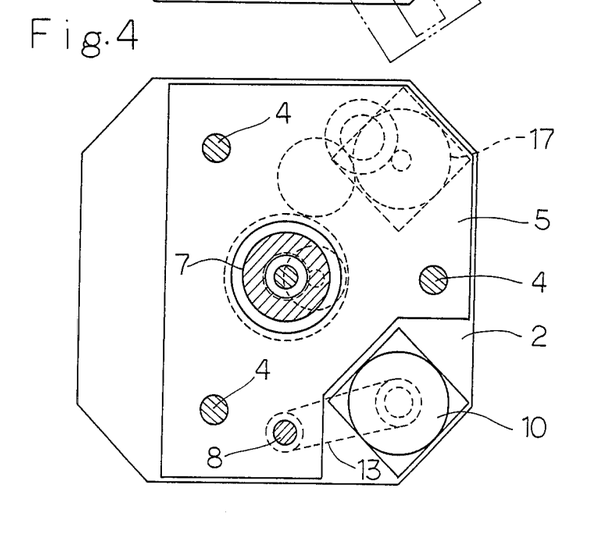
FIG. 4 is a sectional view taken substantially along the line A—A of FIG. 1.
Figure 5:
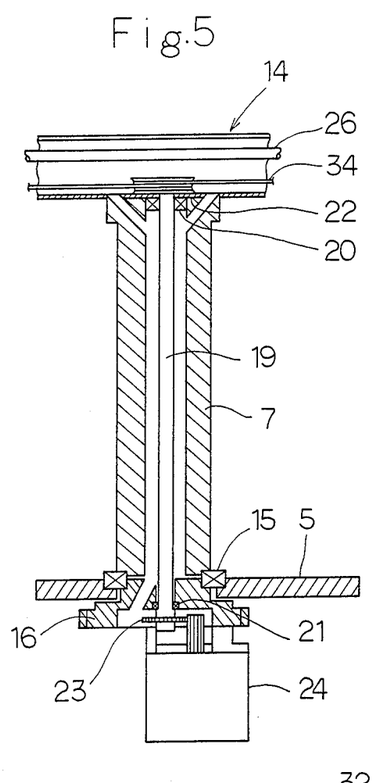
FIG. 5 is a sectional view showing a central portion of FIG. 1.

Referring now to FIGS. 1 and 3, there is shown a system body 1 in which its outer cover is removed. A bottom plate 2 and an upper plate 3 of the system body 1 are linked through three guide bars 4 to each other. The movable plate 5 is disposed in a vertically movable manner and is at the same time guided by the three guide bars 4. The movable plate 5 horizontally fluctuates by the action of ball screws. A cylindrical member 7 is, as illustrated in FIG. 5, perpendicularly and rotatably provided at the central portion of the movable plate 5 through a bearing 15. A screw shaft 8 of the ball screw is rotatably and perpendicularly provided between the bottom plate 2 and the upper plate 3. The screw shaft 8 is inserted through the intermediary of the rigid balls into an internal thread 9 formed in a part of the movable plate 5. The screw shaft 8 is rotationally driven by a vertical movement motor 10 mounted on the bottom plate 2 through pulleys 11, 12 and through a belt 13, whereby the movable plate 5 moves up and down. The cylindrical member 7 perpendicularly provided on the movable plate 5 protrudes upwards from a hole formed in the central portion of the upper plate 3. Horizontal moving member 14 is horizontally fixed to the upper end of the cylindrical member 7. On the other hand, a gear 16 is attached to the lower end of the cylindrical member 7. This gear is, as illustrated in FIG. 3, further linked through a plurality of gear wheels 18 to a turning motor 17 fixed to an under surface of the movable plate 5. The cylindrical member 7 and the horizontal moving member 14 are rotated through approximately 360° by the rotation of the turning motor 17. As illustrated in FIG. 5, a shaft 19 is provided within the cylindrical member 7, and bearings 20, 21 are interposed therebetween. The upper end of the shaft 19 enters the horizontal moving member 14, in which position a driving pulley 22 is axially installed. The lower end of the shaft 19 is fitted in a recessed portion formed in the gear 16, in which position a pinnion 23 is axially attached. A horizontal moving motor 24 by which the shaft 19 is driven through the pinion 23 is fixed to an under surface of the gear 16 provided at the lower end of the cylindrical member 7. Owing to this arrangement, the driving pulley 22 within the horizontal moving member 14 is rotationally driven. A space formed in the cylindrical member 7 communicates with the inside of the horizontal moving member 14, and a wire for a sensor or the like is distributed therethrough.

Figure 6:
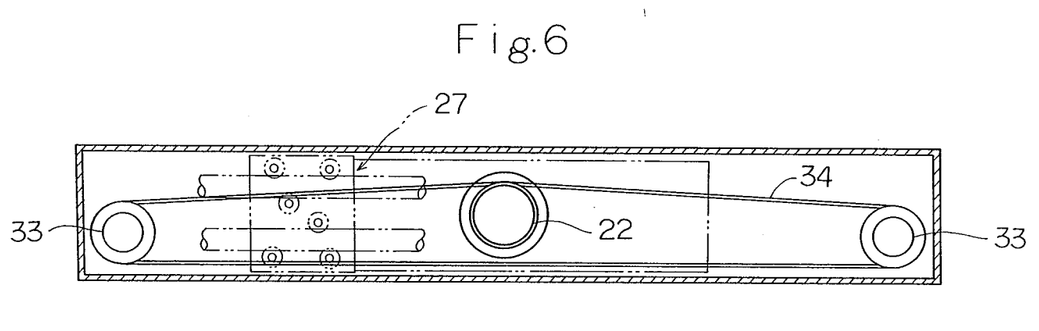
FIG. 6 is an enlarged horizontal sectional view of a horizontal moving member.
Figure 7:
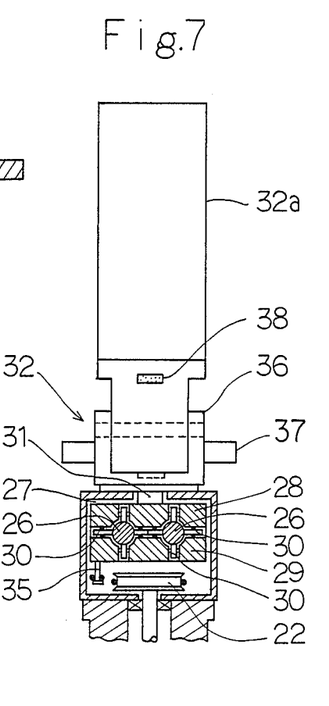
FIG. 7 is an enlarged cross-sectional view of the horizontal moving member.

The horizontal moving member 14 is, as shown in FIGS. 6 and 7, so formed as to assume a configuration like a long thin box. A slit-like opening is formed in the upper surface of the horizontal moving member 14 in the longitudinal direction thereof. Two guide shafts 26 are disposed at a given spacing in the horizontal moving member 14 in its longitudinal direction. A carriage 27 is so supported on the guide shafts 26 as to be horizontally movable. Fourteen rollers 30 are axially supported in lateral and vertical directions between the carriage 27, the upper plate 28 and the lower plate 29. Each individual roller 30 impinges upon the guide shaft 26, and the carriage 27 is allowed to travel in the longitudinal direction of the horizontal moving member 14. On the upper plate 28 of the carriage 27 is provided an arm installation member 31 in such a way that it protrudes upwards from the opening formed in the upper portion of the horizontal moving member 14. A rotary arm 32 is rotatably and pivotally supported on the upwardly protruded arm installation member 31.

To be specific, the bracket 36 is fixed to the arm installation member 31, and the rotary arm 32 is axially supported through a rotary shaft 37 on the bracket 36 so that this arm 32 vertically rotates through an angle of approximately 90°. The rotary arm 32 is constituted by disposing a thin plate-like wafer arm 32a and a fork-like cassette arm 32b in positions orthogonal to each other, this rotary arm 32 being rotatable from a position in which the wafer arm 32a is horizontally disposed on the bracket 36 to a position in which the cassette arm 32b is horizontally disposed. A magnet 38 is provided in a position in which the bracket 36 stands vis-à-vis with the proximal portion of the rotary arm 32 to stabilize the horizontally rotary position of the arm.

On the other hand, pulleys 33 are axially supported on both ends of the bottom within the horizontal moving member 14. A wire coated with synthetic resin is spanned with proper tension between the centrally disposed driving pulley 22 and the bilaterally disposed pulleys 33. In this case, the driving pulley 22 is wound with a turn of the wire 34. A turn of the wire 34 spanned between the pulleys 33 is further wound on a hook 35 which projects downwards from the lower plate 29 of the carriage 27 positioned upwards. The carriage 27 travels within the horizontal moving member 14 by the rotary movement of the wire 34.

Figure 10:
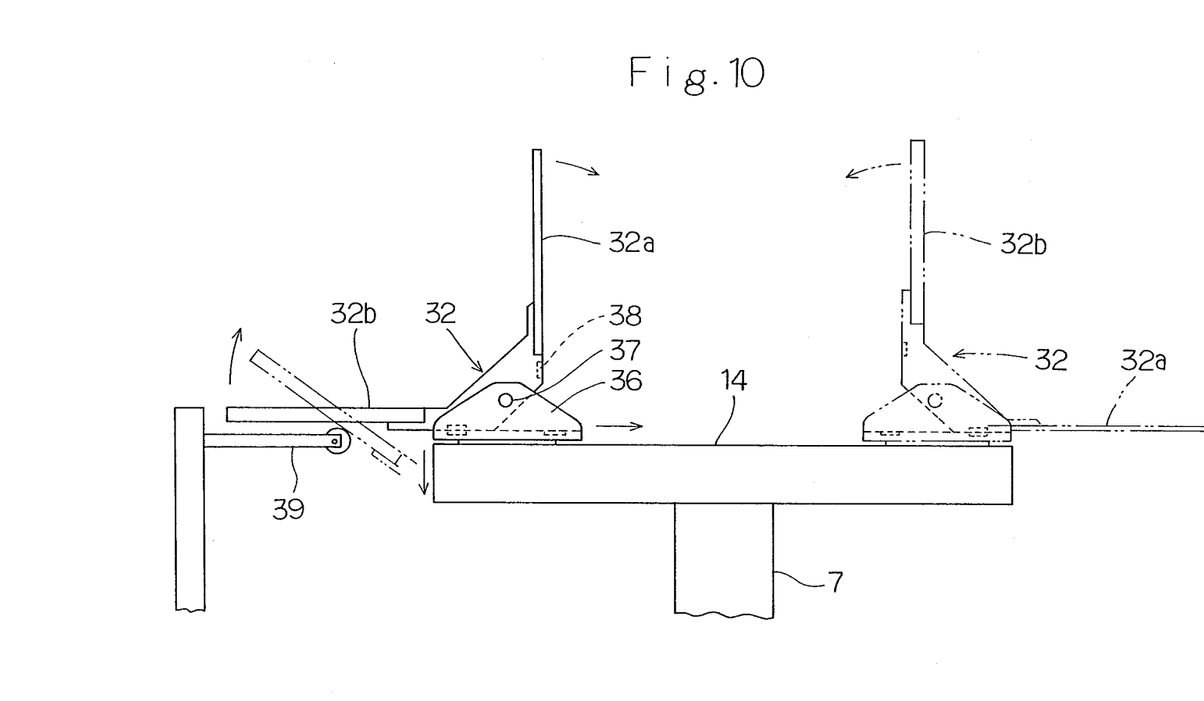
FIG. 10 is a front view of an upper portion of the carrier system, showing an operational situation.

When the rotary arm 32 descends, this arm, as illustrated in FIG. 10, rotates while causing the wafer arm 32a assuming horizontality or the cassette arm 32b to impinge upon a fixed protrusion, and hence an arm 39 fitted with a roller is protrusively fixed to a stand or the like in a proper position accessible by the rotary arm 32.

It is to be noted that the above-mentioned gear, gearwheel and pinion are composed of the synthetic resin in order to prevent creation of the metallic powder which is caused by metallic abrasion.

Figure 8:
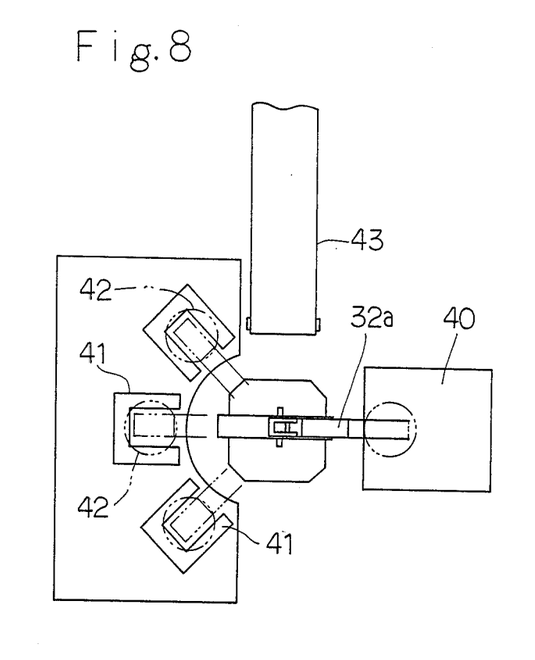
FIG. 8 is a plan view showing placement of the carrier system.
Figure 9:
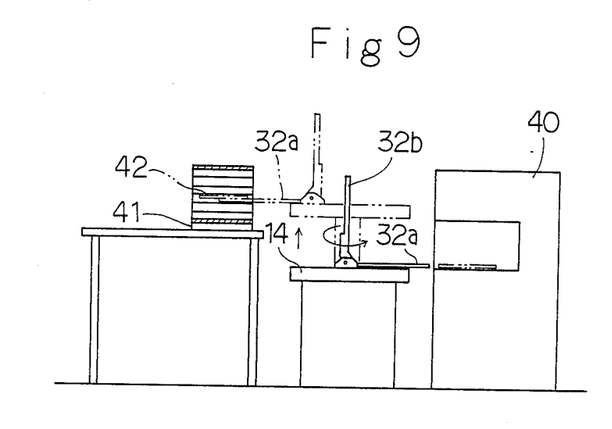
FIG. 9 is a front view showing the placement of the carrier system.

The thus constructed carrier system placed within the clean room carries the cassette accomodating the wafers while raising it, and further transfers the wafers from the shelf type cassette onto the stage of the processing device. The carrier system thereafter returns the wafers to their own specified positions in the cassette 41. The rotary arm 32 loaded with the silicon wafer 42 is capable of making the up-and-down motion, turning motion and horizontal to-and-fro motion. The carrier system is, as shown in FIGS. 8 and 9, installed in front of a unit of processing device 40, and a plurality of cassettes 41 each having multistage shelf are so arranged as to stand vis-àvis with the processing device 40. In addition, a conveyor 43 for carrying the cassette 41 is disposed in the vicinity of a table. With this arrangement, it is feasible to effectively utilize the space formed within the clean room.

Figure 11:
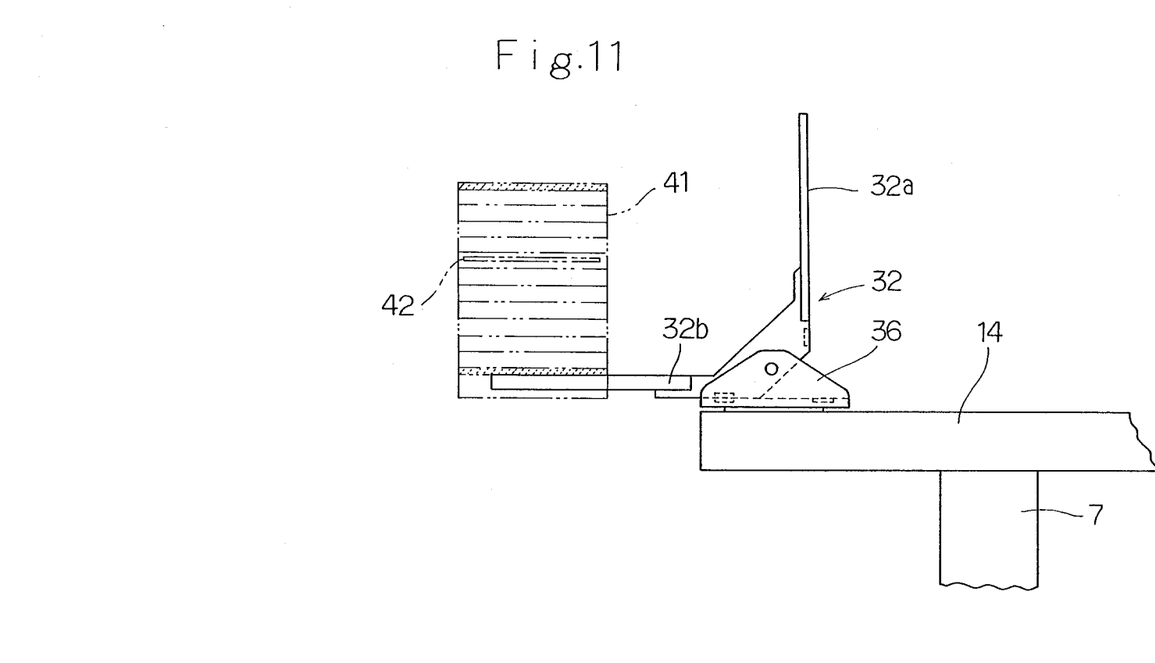
FIG. 11 is a front view of a cassette arm, showing the operations thereof.

In the case of placing the cassette 41, accomodating the silicon wafers, which is carried by the conveyor 43 on the table, the carrier system causes the horizontal moving member 14 to turn, ascend and descend while the cassette arm 32b assumes a horizontal posture or the carriage 27 moves. With this step, as shown in FIG. 11, the cassette arm 32b is inserted in the bottom of the cassette 41 to raise it and is then transferred onto an adequate portion of the table.

Upon completion of the transfer of the cassette 41, the carrier system, as illustrated in FIG. 10, causes its rotary arm 32 to be brought close to the roller-attached arm 39 disposed on the stand to push it down from the above, whereby the rotary arm 32 is vertically rotated through an angle of 90°. Then the wafer arm 32a is horizontally placed.

As shown in FIGS. 8, 9, the silicon wafers 42 are carried one by one from each individual cassette 41 to the processing device in the following manner.

When taking the silicon wafers 42 out of the shelf of the cassette 41, the cylindrical member 7 and the horizontal moving member 14 are made to rotae through approximately 180° by driving the turning motor 17. Then the wafer arm 32a is made to face the cassette 41, and at the same instant the vertical movement motor 10 is actuated, whereby the movable plate 5, the cylindrical member 7 and the horizontal moving member 14 are raised up to a desired level of the shelf. In the wake of this step, a horizontal movement motor 24 is actuated, and the carriage 27 moves on the horizontal moving member 14 towards the cassette 41 by the rotational movement of the driving pulley 22 and the wire 34, whereby the wafer arm 32a is inserted beneath the desired shelf. In such a state, upon slight actuation of the vertical movement motor 10, the rotary arm 32 (the entire horizontal moving member) is a little bit raised, and the silicon wafer 42 is loaded on the wafer arm 32a. In the second place, horizontal movement motor 24 resumes its operation, and then the carriage 27—the rotary arm 32—reverts to the central portion while being loaded with the wafer. Subsequently, immediately when the vertical movement motor 24 and the turning motor 17 are actuated, the rotary arm 32 returns to the initial position opposite to the stage of the processing device 40. Then the horizontal movement motor 24 is operated once again, whereby the rotary arm 32 moves forwards. The vertical movement motor 10 is slightly actuated while the wafer 42 is brought close to the stage, and the rotary arm 32 is a little bit lowered. The wafer is then placed on the stage of the processing device 40. Thereafter, the carriage 27 and the rotary arm 32 revert to their initial positions.

Upon completion of the processes by the processing device, the rotary arm 32 of the carrier system is operated in reverse order of the above-described steps. The rotary arm 32 advances onto the stage to raise the wafer 42 and carry this wafer up to the very shelf of the cassette 41 from which the wafer is taken, thus returning the wafer 42 to the shelf. Such operations are repeated with respect to the individual wafers which are put on the shelves of each cassette 41. The processes indispensable for the transfer of the silicon wafers are thus executed.

After the silicon wafer has been processed, the wafer arm 32a of the carrier system is placed on the roller-attached arm 39 disposed on the stand. The rotary arm 32 is turned to a position in which the cassette arm 32b takes the horizontal posture by lowering the wafer arm 32 in the same manner as above. The cassette arm 32b is inserted in the bottom of the cassette 41 loaded on the table to raise it by turning, raising and lowering the horizontal movement member 14 or by moving the carriage 27. Then the cassette 41 accomodating the processed silicon wafers 42 is carried to the conveyor 43.

The above-described operations of the carrier system can be performed by manually operating a control panel equipped with a variety of switches, or by effecting full-automatic program control with the aid of a sequence controller which employs a microcomputer. In this case, the controller is invested with a teaching function to store coordinates of the shelves of the respective cassettes. The controller can be used by freely determining the position of the cassette and the level of the shelf.

Figure 12:
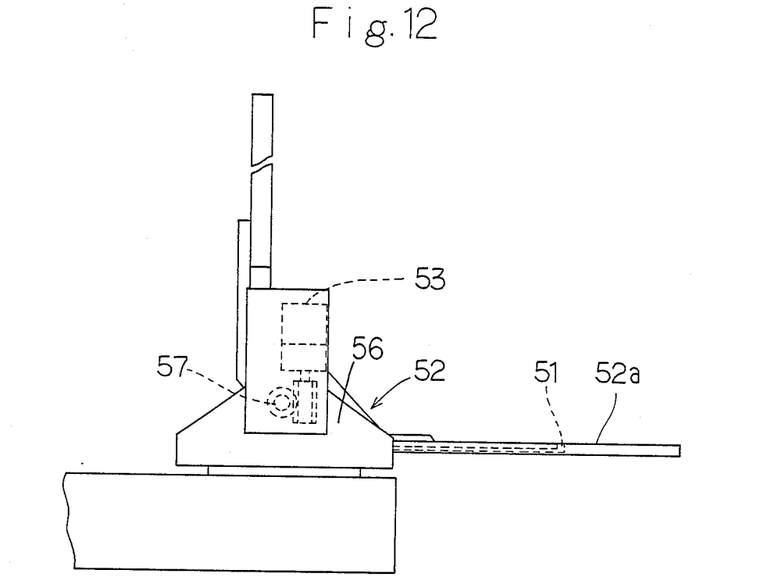
FIG. 12 is a front view of a rotary arm, showing another embodiment of the present invention.
Figure 13:
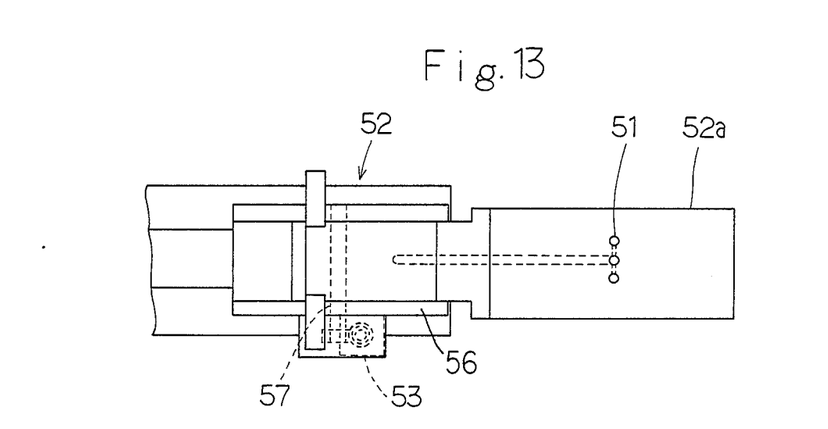
FIG. 13 is a plan view thereof.

In the above-described embodiment, the rotary arm 32 loaded with the silicon wafer is carried. However, as shown in FIGS. 12, 13, the upper surface of a wafer arm 52a is formed with adsorbing holes 51 from which the internal suction is effected through a suction passage formed in the arm or through a suction tube. With this arrangement, the wafer is adsorbed onto the arm 52a, thereby making it possible to carry the wafer more securely.

Furthermore, the arrangement can be made as follows. Motor 53 equipped with a speed reducer is fitted to the bracket 56, and a rotary shaft 57 of the rotary arm 52 is linked through a gear to the motor 53, whereby the rotary arm 52 rotates through approximately 90°.

On the carriage is installed the rotary arm including the wafer arm and the cassette arm which are rotated in the horizontal position; and the horizontal movement member for moving the carriage is so constituted as to be turnable and vertically movable. Owing to this constitution, it is feasible to carry the electronic parts in three dimensions and to efficiently carry the silicon wafers and the cassette accomodating these wafers to arbitrary positions such as the table, conveyor and the stage of the processing device. Moreover, a unit of carrier system suffices for taking the silicon wafers in and out of the cassette and for carrying the cassette itself, this leading to a decrease in cost of equipments and to effective utilization of the space formed within the narrow clean room.

What is claimed is:

1. A carrier system for a silicon wafer, comprising:
  (a) a bottom plate;
  (b) a plurality of guide bars vertically provided on said bottom plate;
  (c) an upper plate fixed to said guide bars;
  (d) a screw shaft perpendicularly provided in a rotatably drivable manner between said upper plate and said bottom plate;
  (e) a movable plate supported on said guide bars in a vertically slidable manner between said upper plate and said bottom plate, said movable plate being vertically driven by dint of rotation of said screw shaft;
  (f) a cylindrical member perpendicularly provided on said movable plate in a rotationally drivable manner, said cylindrical member penetrating said upper plate and protruding upwards;
  (g) a horizontal movement member fixed to an upper end of said cylindrical member;
  (h) a carriage linked to a driving wire spanned between pulleys which are axially supported within said horizontal movement member, said carriage being so disposed within said horizontal movement member as to be horizontally movable; and
  (i) a rotary arm pivotally so supported on said carriage as to be vertically rotatable through approximately 90°, said rotary arm including a wafer arm and a cassette arm which are disposed at a right angle to each other.

2. A carrier system for a silicon wafer as set forth in claim 1, wherein an upper surface of said wafer arm of said rotary arm is formed with adsorbing holes.

3. A carrier system for a silicon wafer as set forth in claim 1, wherein a rotary shaft of said rotary arm is linked through a gear to a motor whereby said rotary arm rotates through approximately 90°.

* * * * *